US005619177A

United States Patent [19]
Johnson et al.

[11] Patent Number: 5,619,177
[45] Date of Patent: Apr. 8, 1997

[54] SHAPE MEMORY ALLOY MICROACTUATOR HAVING AN ELECTROSTATIC FORCE AND HEATING MEANS

[75] Inventors: A. David Johnson, San Leandro; Barry Block, Los Altos; Philip Mauger, Santa Clara, all of Calif.

[73] Assignee: MJB Company, San Leandro, Calif.

[21] Appl. No.: 381,681

[22] Filed: Jan. 27, 1995

[51] Int. Cl.⁶ .................................................. H01H 61/06
[52] U.S. Cl. ..................... 337/140; 337/141; 251/129.01; 60/527
[58] Field of Search ....................................... 337/140, 141; 60/527, 528; 251/129.01, 129.02

[56] References Cited

U.S. PATENT DOCUMENTS

| | | | |
|---|---|---|---|
| 4,585,209 | 4/1986 | Aine et al. | 251/129.02 |
| 5,061,914 | 10/1991 | Busch et al. | 337/140 |
| 5,309,717 | 5/1994 | Minch | 60/527 |
| 5,325,880 | 7/1994 | Johnson et al. | 137/1 |
| 5,344,117 | 7/1994 | Trah et al. | 251/11 |

OTHER PUBLICATIONS

Zengerle et al., "Performance simulation of microminiaturized membrane pumps," *Technical Digest of Transducers* (1993).
Bosch et al., "A silicon microvalve with combined electromagnetic/electrostatic actuation," *Sensors and Actuators A*, 37–38:684–692 (1993).
Hälg, "On a Nonvolatile Memory Cell Based on Micro-Electro-Mechanics," *IEEE Transactions*, vol. 37, No. 10, Oct. 1990.
Timoshenko, "Analysis of Bi–Metal Thermostats," *J. Optical Soc.* 11:233–256 (1925).

*Primary Examiner*—Leo P. Picard
*Assistant Examiner*—Jayprakash N. Gandhi
*Attorney, Agent, or Firm*—Flehr, Hohbach, Test, Albritton & Herbert

[57] ABSTRACT

A microactuator and method of operation is disclosed for use in actuating valves, electrical contacts, light beams, sensors and other elements between different actuation modes. An actuator member comprised of a shape memory alloy layer is mounted on an elastic substrate, and the proximal end of the actuator member is carried by a base. The shape memory alloy material is heated through its phase change transition temperature so that it deforms by changing volume to bend the distal end of the actuator member in a first direction relative to the base. Stress forces in the substrate oppose the bending movement, and when the shape change layer is cooled below the transition temperature the stress forces move the distal in a second direction which returns the shape change layer to its low temperature shape. Electrostatic forces are selectively applied between the actuator member and base for clamping the actuator member in one of its positions. In another embodiment a bistable actuator is provided in which the actuator member can be operated between two stable positions.

21 Claims, 4 Drawing Sheets

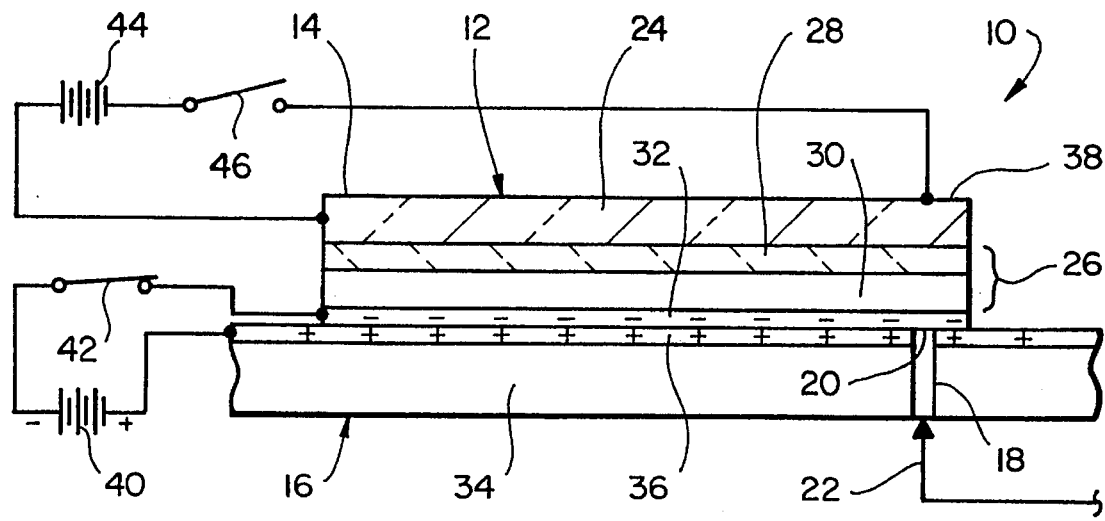
FIG_1A
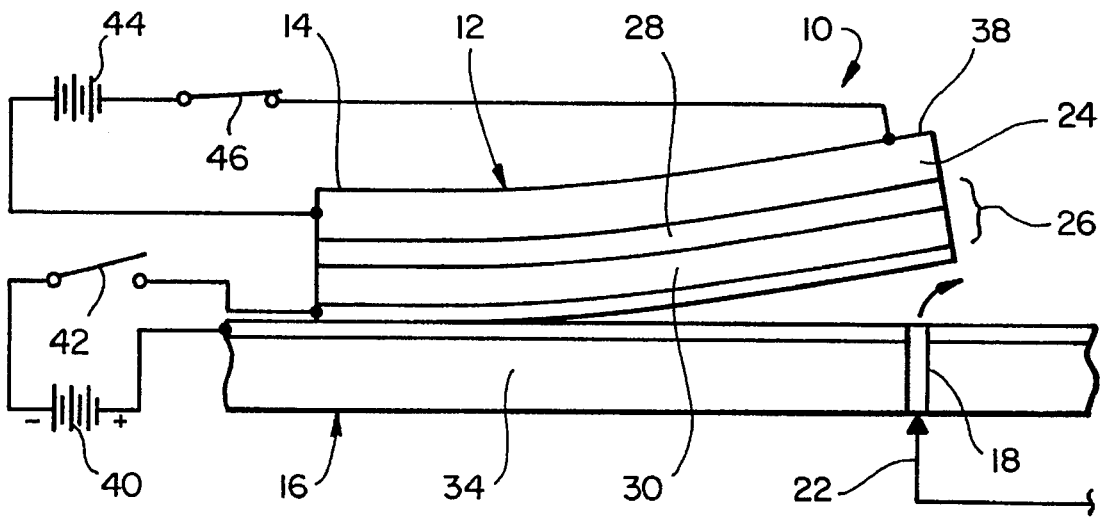
FIG_1B

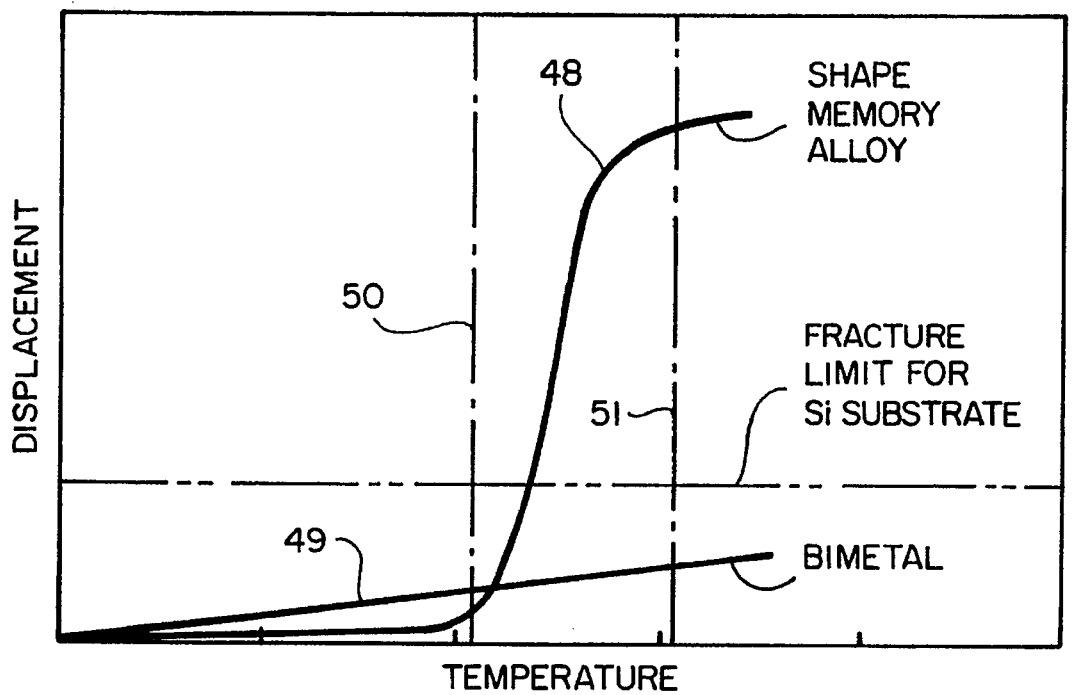
FIG_2
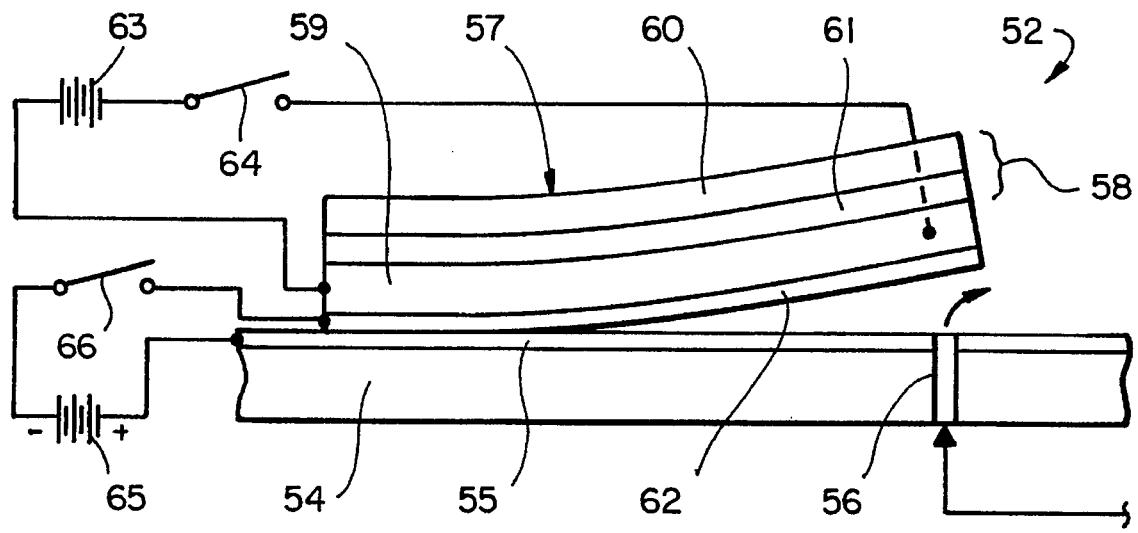
FIG_3

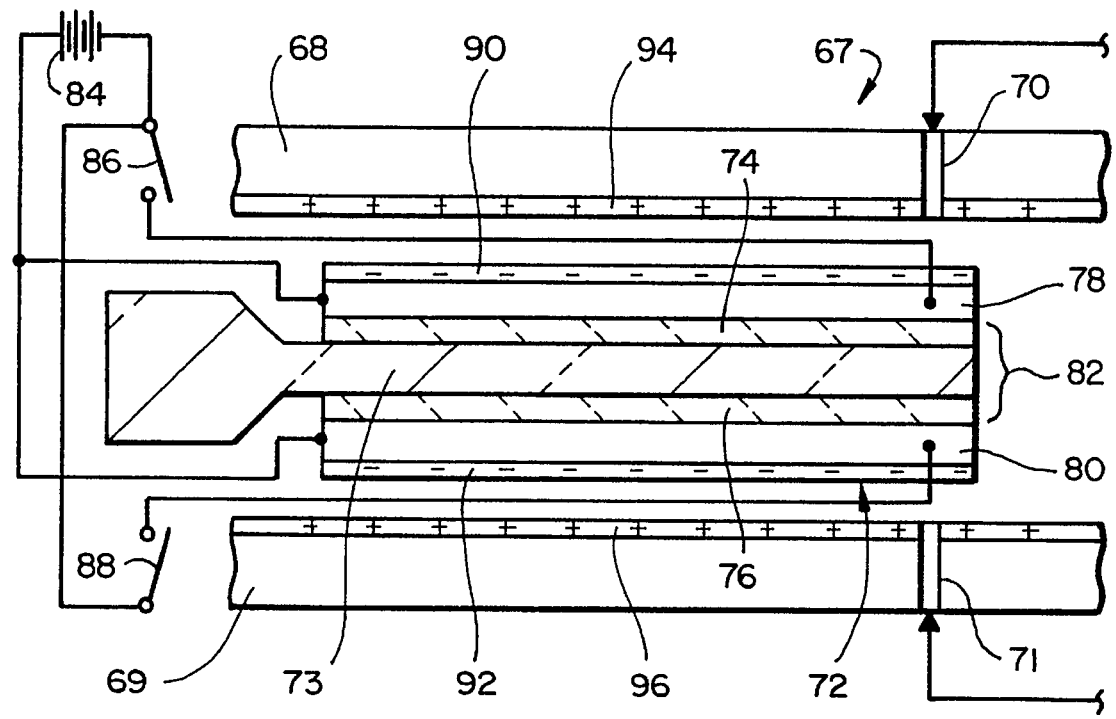
FIG_4
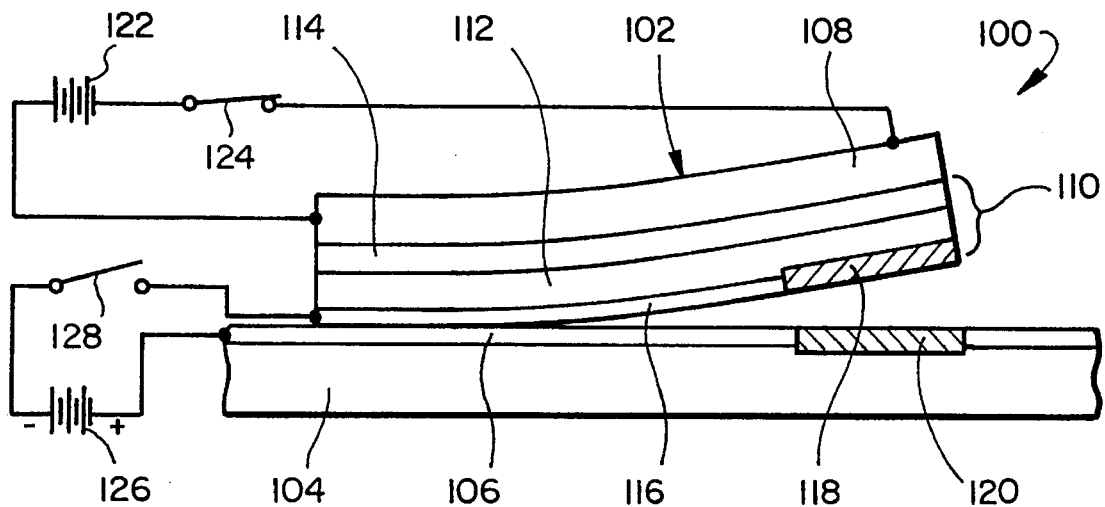
FIG_5

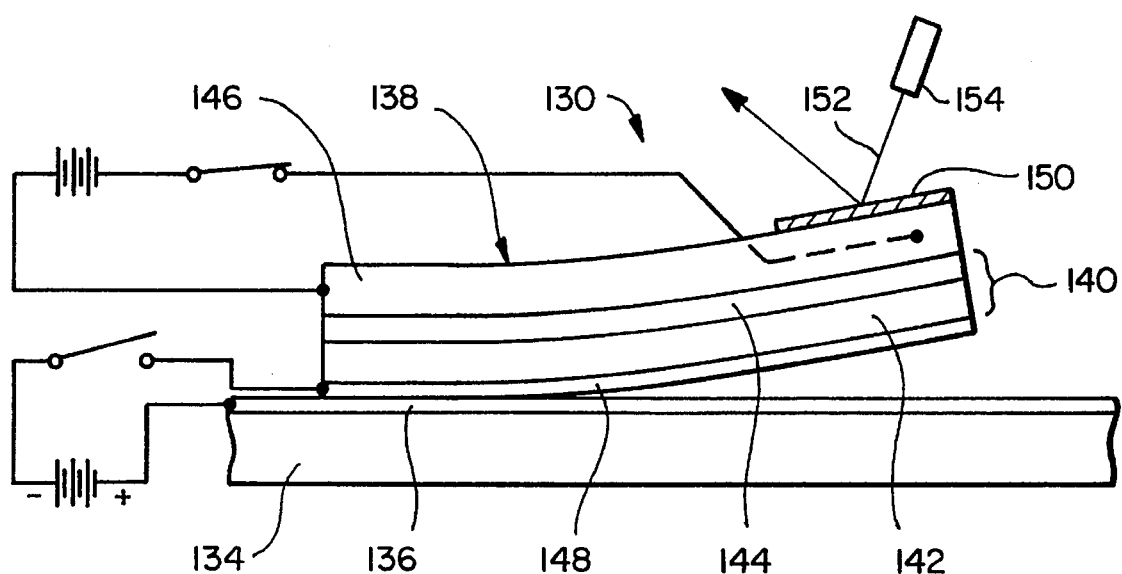
FIG_6
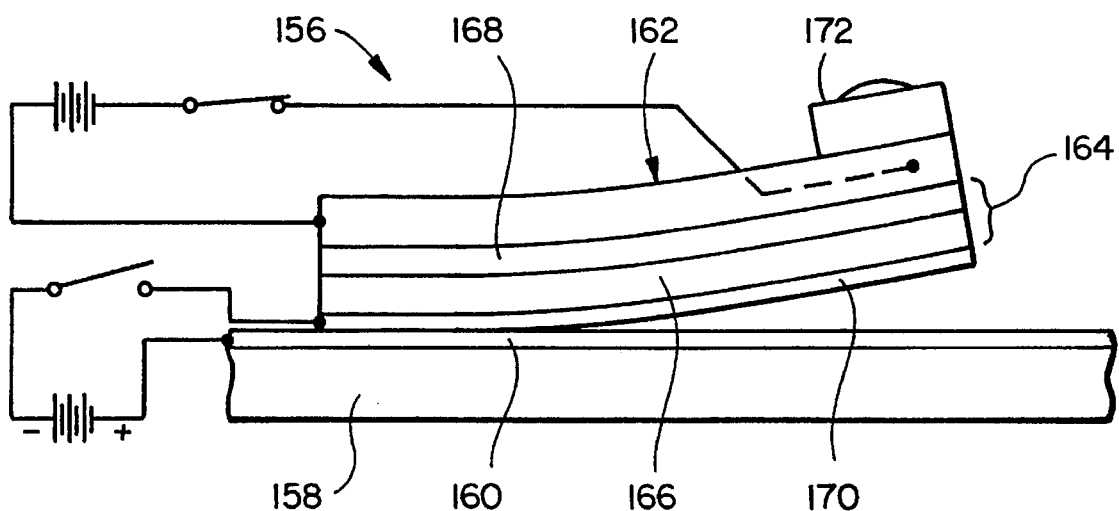
FIG_7

SHAPE MEMORY ALLOY MICROACTUATOR HAVING AN ELECTROSTATIC FORCE AND HEATING MEANS

BACKGROUND OF THE INVENTION

1. Field of the Invention

This invention relates in general to microactuators for use in microdevices such as miniature valves, switches and sensors. The microactuators of the invention have application in fields such as air flow control for heating, ventilation and air conditioning, portable gas chromatographs, fluidic technology, end effectors for microrobotic manipulators, mass flow controllers in food and pharmaceutical processing and the like.

2. Description of the Related Art

Shape memory alloy ("SMA") materials such as Nitinol, an alloy of nearly equal atomic weights of Nickel and Titanium, are characterized in being easily deformed when cold (i.e. at a temperature below the material's phase change transition temperature), and which produce large stress forces, with shape recovery of several percent, when heated through the transition temperature in which the crystalline phase change is from martensite to austenite. One important application of SMA materials is for use in microactuators. U.S. Pat. No. 5,061,914 to Busch et al. issued Oct. 29, 1991 entitled Shape-Memory Alloy Micro-Actuator, assigned to TiNi Alloy Company of San Leandro, Calif., describes methods of producing microactuator elements which employ the vacuum deposition of thin film SMA onto substrates. U.S. Pat. No. 5,325,880 to Johnson et al. entitled Shape Memory Alloy Film Actuated Microvalve issued Jul. 5, 1994, and assigned to TiNi Alloy Company, discloses thin film SMA microvalves for use in controlling the flow of gas or liquid fluids. One advantage of SMA film in microactuators is its ability to produce large forces and displacements within small spaces at voltage levels which are compatible with electronics.

Macroscopic devices such as valves and sensors are typically assembled from individual components. In comparison, microactuators employing SMA film can be fabricated from monolithic silicon in methods which produce hundreds of devices on a single substrate in parallel processes. The cost per device is greatly reduced by such batch processing.

Micro-electro mechanical systems ("MEMS") in the future will require the integration of active as well as passive microdevices. Passive devices such as sensors have become a mature market, but active devices such as valves are not as widely used. The integration of passive and active mechanical devices, and eventually electronics, is a necessary step which is in nascent development. The progression is analogous to the development of solid-state electronics devices from resistors and capacitors to transistors, and then to integrated circuits.

During the past twenty-five years, research in the area of micro-fabricated sensors has revealed that the impact of micro-fabricated discrete sensors on biological and chemical applications remains limited. Practical applications in these fields require integrated analysis systems, not simply sensors. The attractiveness of the concept of a micro-fabricated integrated analysis system is that it will allow portable, rapid and complete measurements with the underlying analytical complexity hidden from the user. Potentially they will have great impact on many areas of application, such as analytical chemistry and measurements in environmental, biological and clinical chemistry. Typical analytical systems require sample handling steps such as mixing, dilution and calibration, thereby limiting the ability to miniaturize a complete system. For example, valves and pumps currently fulfill these important functions in handling liquid samples. In order to obtain the full benefit of micro-fabrication technology, these valves and pumps must also be micro-fabricated and integrated with the other system components.

Miniaturization of mechanical devices is motivated by portability, for example the portable gas chromatograph. Other considerations are cost and physical dimensions. In fluid systems for analysis of biological and chemical fluids, it is essential to reduce dead volumes to a minimum, otherwise analyses are not cost effective. A typical fluid control system requires a valve with a flow rate of microliter per minute at low pressure. Typically a miniature pneumatic valve is driven by a remote solenoid. This solution is unsatisfactory for several reasons. Besides being inelegant, it is impossible to construct very small pneumatic valves as, for example, arrays of valves on a single substrate. Further, the time behavior of the valves is influenced by the interconnections. A strong demand currently exists for an electrically powered actuator that is compact in size so that it may be placed in the immediate vicinity of a valve closure, yet forceful enough to provide adequate opening. SMA film technology addresses this need.

Among the other valve actuation mechanisms under development are those which employ electrostatic forces to open and close the valve. In such systems the high voltages that are required are incompatible with other electronic components. Another approach to microvalves includes the encapsulation of fluid phase-change devices, which have the disadvantage of slow actuation and the potential for fluid to escape. Another such microvalve approach is the use of piezoelectric actuators, which requires relatively more mass and volume to produce the required force and stroke.

Thin film actuators employing SMA can produce ten joules per cubic centimeter per cycle, which is at least an order of magnitude higher energy density than other types of actuator mechanisms. Using TiNi as the SMA material, the devices can be fabricated on silicon substrates which are then micro-machined using MEMS photolithography and selective etching techniques. Microribbons of TiNi have been produced that demonstrated repeated recovery of 3% strain under 30 ksi stress. Intrinsic materials properties are equal to or superior to those of bulk TiNi.

OBJECTS AND SUMMARY OF THE INVENTION

It is a general object of the present invention to provide a new and improved microactuator employing SMA for operating elements such as valves for controlling fluid flow through an orifice, or for operating electrical contacts, sensors and the like between different modes of actuation.

Another object is to provide a new and improved method of operating an SMA actuator for operating elements, such as valves for controlling fluid flow through an orifice, or for operating electrical contacts, sensors and the like between different modes of actuation.

The invention in summary provides a microactuator and method of operation in which an actuator member is comprised of an SMA shape change layer mounted on an elastic substrate and in which the proximal end of the actuator member is carried by a base. When the shape change layer is heated through its phase change transition temperature it deforms by changing volume from a low temperature shape toward a memory shape causing the distal end of the member to bend in a first direction relative to the base. Stress forces established in the substrate oppose the bending movement of the shape change layer, and when the shape change layer is below the phase change transition temperature the stress forces move the distal end in a second direction returning the layer to its low temperature shape. Clamping means is provided for applying electrostatic forces for selectively clamping the distal end of the base. In another aspect of the invention a bistable microactuator is provided in which the actuator member is mounted between a pair of bases. The actuator member comprises a pair of shape change layers which are mounted with respective elastic substrates and in which selected ones of the shape change layers are heated to cause the actuator member to move toward either of two operating positions.

The foregoing and additional objects and features of the invention will appear from the following specification in which the several embodiments have been set forth in detail in conjunction with the accompanying drawings.

BRIEF DESCRIPTION OF THE DRAWINGS

FIG. 1A is a schematic cross sectional view of a microactuator in accordance with one embodiment of the invention showing the components in one operating position.

FIG. 1B is a view similar to FIG. 1A showing components of the microactuator in another operating position.

FIG. 2 is a graph plotting displacement as a function of temperature for the SMA actuator of the invention shown in comparison with the performance of a typical bimetal actuator.

FIG. 3 is a schematic cross sectional view of a microactuator in accordance with another embodiment.

FIG. 4 is a schematic cross sectional view of a microactuator in accordance with another embodiment.

FIG. 5 is a schematic cross sectional view of a microactuator in accordance with another embodiment.

FIG. 6 is a schematic cross sectional view of a microactuator in accordance with another embodiment.

FIG. 7 is a schematic cross sectional view of a microactuator in accordance with another embodiment.

DESCRIPTION OF THE PREFERRED EMBODIMENTS

FIGS. 1A and 1B illustrate generally at 10 a microactuator in accordance with one embodiment for use as a valve in controlling the flow of a fluid, such as a gas or liquid. Microactuator 10 is comprised of a valve actuator 12 which is carried by its proximal end 14 on a base 16. Extending through the base is a fluid flow orifice 18 which emerges through a port 20 on the upper surface of the base. The lower end of the orifice is connected with a suitable conduit or channel 22 which leads to the fluid supply, not shown. In the position shown in FIG. 1A the lower surface of the valve actuator rests against the port and occludes the orifice to close the valve. To open the valve, the valve actuator is bent upwardly to the position shown in FIG. 1B in the manner explained below so that the port is uncovered sufficient to permit fluid flow through the orifice to a downstream channel, not shown.

Valve actuator 12 is in the form of an elongate composite beam with a top shape change layer 24 of SMA material mounted on an elastic substrate 26. Substrate 26 is comprised of a layer 28 of $SiO_2$ material over a layer 30 of Si material. A layer 32 of electrical charge-carrying material is formed along the lower surface of the actuator member. This layer 32 can be formed by doping the lower portion of Si layer with a suitable dopant, such as Boron, in an amount sufficient to carry an electric charge. The layer 32 could also comprise a thin film of a suitable metal, such as Au or Ag. Base 16 is comprised of a lower layer 34 of Si and an upper layer 36 of a suitable electric charge-carrying material. The layer 36 could also comprise a portion of the Si layer 34 doped with a dopant such as Boron, or a thin film of a suitable metal.

While in this embodiment substrate layer 26 is described as being formed of Si, other suitable materials with elastic properties could be employed. For example, the layer could be comprised of a metal with an oxide, preferably an oxide which is an electric insulator. The layer could also be comprised of plastics of the type used in micro-fabrication, such as polyamide.

In the fabrication of substrate 26, the $SiO_2$ layer 28 grows on the Si such that the $SiO_2$ inherently wants to occupy a larger volume. As a result the $SiO_2$ develops a large internal stress force. This stress force, because the Si and $SiO_2$ layers are bonded together, is applied in a direction which yieldably bends the substrate, and therefore the actuator member, downwardly toward base in the embodiment of FIGS. 1A and 1B. This downward bending moment is opposite to the upward bending force produced by SMA layer when it is actuated. Therefore when the SMA layer is not actuated the downward bending moment produced by $SiO_2$ 28 layer moves the actuator member down to close the orifice port. This is a normally closed valve configuration.

When the SMA material of shape change layer 24 is below its transition temperature, the stress forces of $SiO_2$ layer 28 are sufficiently large to plastically deform layer 24 to the low temperature shape of FIG. 1 A, which is the normally closed position of the valve.

Clamping means is provided for increasing the closure force holding actuator member 12 in its normally closed position against the orifice port. This clamping means applies an electrostatic force between the distal end 38 of the actuator member and the base to selectively clamp the distal end to the base. A suitable electric charge source is provided and is shown schematically in FIGS. 1A and 1B as comprising a battery 40 having one terminal connected through on-off switch 42 with charge-carrying layer 32 on the actuator member, and the other terminal is connected with charge-carrying layer 36 on the base. Switch 42 is closed to produce current flow in the circuit which places a charge, shown for example as a positive charge, on layer 32 and an opposite charge, shown as a negative charge, on layer 36. The opposite charges cause an electrostatic attraction between the distal end and base, and the electrostatic force is relatively large at the micro-distances involved in the invention so that a secure valve-closing clamping force is provided. Minimal power input is required in that the electrostatic force is required only when the valve is closed. These electrostatic forces can be calculated from the following equation:

$$F(\text{Newtons}) = \frac{1}{2} \epsilon \cdot \epsilon_o \cdot A \cdot V^2/d^2 \qquad \text{(Equation 1)}$$

where:

A is area in meters

V is in volts d is in meters $\epsilon_o = 8.8 \times 10^{-12}$ farads/meter $\epsilon$ is dielectric constant Assuming for example that:

V=10 volts (which is below the Hydrogen sparking potential of 13.6 V)

d=1 µm $\epsilon$=3

Solving Equation 1 using a conversion unit of 1 psi=6.89 kilonewtons/ meter² gives the electrostatic pressure of approximately ½ psi.

Heating means is provided for heating the SMA material of layer 24 through its phase change transition temperature. The heating means preferably comprises means for passing electric current through the layer for I²R resistance heating. In FIGS. 1A and 1B the heating means is shown schematically as the battery 44 connected with the SMA layer 24 through a circuit which includes an on-off switch 46. The switches of the heating and clamping circuits can be operated by a suitable control circuit, such as a computer microprocessor, not shown.

To open the flow valve, switch 42 is opened to remove the electrostatic clamping force, and at the same time switch 46 is closed to heat the SMA material of layer 24 through the shape change transition temperature. The SMA material changes shape by contraction to produce tension, which creates bending stresses in substrate 26. These bending stresses are sufficiently larger than the downward bending moment from SiO₂ layer 28 so that actuator member 12 bends upwardly to open the orifice port, permitting fluid to flow.

Valve actuation is rapid and uses energy only during the phase change. When the actuator member reaches its fully opened position, switch 46 is opened to stop current flow and the I²R heating effect. Even as the SMA material cools the actuator member will stay open against the bending forces from SiO₂ layer 28 until the layer's temperature is below the transition temperature.

One example of the configuration for a microactuator in accordance with the embodiment of FIGS. 1A and 1 B is that in which that actuator member 12 is comprised of a shape change layer 24 of Nitinol which is 2µ thick, elastic substrate 26 is comprised of an SiO₂ layer 28 which is 1µ thick and Si layer 30 is 20µ thick. The distal end 38, which is the cantilever portion, of the actuator member is 1 mm in length so that the vertical deflection between fully open and fully closed positions of the distal end is about 30µ.

Preferably the actuator member and base are fabricated in an integrated flow control module on a silicon die using known micro-machining techniques. These techniques include growing layers of oxide and/or nitride on silicon, photolithographic patterning, selective etching using anisotropic etchants, thermal evaporation and vacuum sputter deposition.

The SMA material Nitinol is an alloy of nearly equal atomic weights of Nickel and Titanium. Other suitable SMA materials include CuAlNi and TiNiPd alloys. Such an SMA material can be easily deformed when cold (i.e. at a temperature below the material's phase change transition temperature), and produces large stress forces, with shape recovery of several percent, when heated through the transition temperature. As used herein, the phrase "heated through the transition temperature" includes both the case of heating the material to within the relatively narrow temperature range at which the phase change takes places, or heating it to a temperature above that range. As the phase change from martensite to austenite takes place, the material changes from a low temperature shape to its memory shape.

A characteristic of SMA materials is that they undergo a volume change associated with the phase change. The present invention makes use of this characteristic to produce movement of actuator member 12 by providing an SMA material which undergoes contraction to its memory shape while being bonded to substrate 26. The volume change or contraction of SMA layer 24 creates stresses in the surface of the substrate, causing it to bend. This principle is similar to the differential thermal expansion in a bimetal system, but with two important differences and advantages in the composite SMA/substrate system of the present invention: the bending stresses created are much larger in the present invention, and the deformation takes place over a narrower range of temperature.

The magnitude of the bending stresses created in the composite SMA/ substrate system of the present invention can be calculated using the mathematical procedures explained by Timoshenko, "Analysis of Bi-Metal Thermostats" 11 J. Optical Soc. Ant. 333 (1925). The graph of FIG. 2 shows in curve 48 generally the displacement or deformation of a typical SMA material as a function of temperature, and the corresponding curve 49 plotting displacement as a function of temperature for a typical bimetal. As shown in this graph, there is a relatively narrow temperature range substantially between the lines 50 and 51 at which a large displacement of the SMA takes place.

FIG. 3 illustrates another embodiment providing a microactuator 52 for use as a normally open valve. The microactuator 52 comprises a base 54 formed at its upper surface with a layer 55 of charge-carrying material. A fluid flow orifice 56 is formed through the base. An actuator member 57 is provided and comprises an elastic substrate 58 and a shape change layer 59 which is formed on the underside of the substrate. The substrate is comprised of a top Si layer 60 below which is grown an SiO₂ layer 61. A layer of charge-carrying material 62 is formed on the lower surface of shape change layer 59.

Heating means for the shape change layer is provided and comprises the battery 63 and switch 64 which are connected in a circuit with the layer 59. Clamping means is also provided and comprises the battery 65 and switch 66 which are connected in a circuit with the charge-carrying layers.

To operate microactuator 52 to its normally open position, both switches 64 and 66 are opened. With the shape change layer 59 below its transition temperature, the upward bending stress forces created by SiO₂ layer 61 are effective to bend the actuator member up and away from the orifice port to the position shown in FIG. 3. To close the valve, switch 64 is closed so that the resulting heating of the shape change layer through its transition temperature causes this layer to change shape by contraction, bending the actuator down to close the orifice. At the same time, switch 65 is closed so that the electrostatic forces between the layers 55 and 62 clamp the valve members closed.

FIG. 4 illustrates another embodiment providing a bistable microactuator 67 for use as a flow control valve. Microactuator 67 is comprised of a pair of bases 68, 69 which are mounted in parallel spaced-apart relationship. The bases are comprised of Si layers through which fluid flow orifices 70, 71 are formed. An actuator member 72 is provided within the gap between the two bases. The actuator member is comprised of an Si layer 73 which extends as a cantilever midway in the gap. Two layers 74 and 76 of SiO₂ are grown on the upper and lower sides of the Si layer, and a pair of shape change layers 78 and 80 are formed above and below the SiO$_2$ layers. The Si layer together with the pair of SiO$_2$ layers forms an elastic substrate 82 which, when bent up or down, produces stress forces which are in opposition to the bending forces of the shape change layers.

Suitable heating means, shown schematically as a battery 84 coupled in a circuit with a pair of on-off switches 86, 88, is provided for selectively heating one or the other of the shape change layers. When switch 86 is closed for resistance heating of upper shape change layer 78 through its phase change transition temperature, then this layer contracts and produces a moment force which bends actuator member 70 upwardly until its distal end contacts base 62 and occludes orifice 66 of the upper valve. At the same time, switch 88 is opened so that the lower shape change layer 80 is below its phase change transition temperature. In this position the actuator member is above the port of orifice 68 so that the lower valve is open for fluid flow. To switch to the other stable position of the microactuator, switch 88 for the lower shape change layer is closed while switch 88 is opened. The resulting heating of the lower shape change layer causes the actuator member to bend downwardly until its distal end occludes the lower orifice. This closes the lower valve and opens the upper valve.

Clamping means is provided for applying electrostatic forces between the distal end of actuator member 70 and the bases in either of the two stable positions. The clamping means comprises layers 90, 92 of electrical charge-carrying materials on the upper and lower surfaces of the actuator member, as well as layers 94, 96 of charge-carrying materials on the facing sides of the two bases. The charge-carrying materials, as well as the source of electrical charge and switching mechanism (not shown), can be of the type described in connection with the embodiment of FIGS. 1A and 1B.

FIG. 5 illustrates another embodiment providing a microactuator 100 for use as an electric control. The microactuator is comprised of an actuator member 102 carried at its proximal end by a base 104. A layer 106 of charge-carrying material is formed on the upper surface of the base in the manner explained in connection with the embodiment of FIG. 1. The actuator member is comprised of a composite beam having a shape change layer 108 bonded on its lower surface to an elastic substrate 110. The substrate is comprised of an Si layer 112 and SiO$_2$ layer 114 fabricated in the manner explained in connection with the embodiment of FIG. 1. A layer 116 of charge-carrying material is formed along the lower surface of Si layer. An electrical contact 118 is embedded in the distal end of the actuator member, and another electrical contact 120 is embedded in the upper surface of base at a position which registers with the upper contact. The contacts are connected through suitable electrical leads, not shown, with the desired electrical circuit.

Heating means, shown schematically as the battery 122 and on-off switch 124, is connected in a circuit with shape change layer 108. A source of electrostatic charge, shown schematically as a battery 126 and on-off switch 128, is also connected in a circuit with charge-carrying layers 106 and 116.

The pair of contacts 118, 120 provide a microswitch which is opened when switch 124 is closed for heating shape change layer 108 and switch 128 is opened for removing the electrostatic clamping force. As the SMA material is heated through its phase change transition temperature, the actuator member bends upwardly to move the two contacts apart. To close the contacts, switch 124 is opened so that the SMA material is cooled below its phase change transition temperature. The downwardly directed bending force exerted by SiO$_2$ 114 layer then plastically deforms the shape change layer back to its low temperature shape as the distal end of the actuator member bends downwardly until the contacts touch each other, thereby closing the circuit. Switch 128 is then closed for applying the opposite electrostatic charges which provide the clamping force for holding the actuator member in a position where the contacts are closed.

FIG. 6 illustrates another embodiment providing a microactuator 130 for use in controlling the path of a light beam. The microactuator comprises a base 134 formed at its upper surface with a layer 136 of charge-carrying material of the type described in connection with the embodiment of FIG. 1. An actuator member 138 is provided and comprises an elastic substrate 140 formed of a layer 142 of Si onto which an SiO$_2$ layer 144 is grown, together with a shape change layer 146 as described in connection with the embodiment of FIG. 1. A layer of charge-carrying material 148 is formed on the lower surface of the Si layer.

A suitable light reflecting or refracting device, such as a layer 150 of Ag metal, is embedded on the top surface of the distal end of the valve actuator. The reflective surface of this layer is disposed in the path of a light beam 152 emitted from a suitable source 154. The beam is reflected in one direction when the distal end of actuator 138 is bent up, and in another direction when the distal end is bent down. The distal end is actuated up and down in the manner described in connection with the embodiment of FIG. 1.

FIG. 7 illustrates another embodiment providing a microactuator 156 for use in moving a sensor to different positions. Microactuator 156 is comprised of a base 158 formed at its upper surface with a layer 160 of charge-carrying material as described in connection with the embodiment of FIG. 1. The microactuator further includes an actuator member 162 comprised of a substrate 164 formed of an Si layer 166 upon which is grown an SiO$_2$ layer 168, and with a layer 170 of charge-carrying material along the lower surface of the Si layer, as described in connection with FIG. 1. The distal end of the actuator member carries a sensor 172, for example a pickup head for use on a CD ROM drive. Up and down bending movement of the distal end of the actuator member carries the sensor to different operating positions, and the distal end is moved in the manner described in connection with the embodiment of FIG. 1.

Front the foregoing it is apparent that there has been provided herein a new and improved microactuator for use in microdevice applications, such as MEMS. The different embodiments of the microactuators of the invention are amenable to wafer-scale operation for reproduceability and low cost. The microactuators can be fit in very small spaces, for example in multiple valve arrays on a single substrate. In a valve application, the microactuator can be turned off and on rapidly to permit accurate measurement of volume transfer. With feedback control, proportional actuation of the microactuator can be achieved, such as in applications requiring partial valve opening.

While the foregoing embodiments are at present considered to be preferred it is understood that numerous variations and modifications may be made therein by those skilled in the art and it is intended to cover in the appended claims all such variations and modifications as fall within the true spirit and scope of the invention.

What is claimed is:

1. A microactuator for controlling an element between different actuation modes, the microactuator comprising the combination of (a) a base; (b) an actuator member which extends along a longitudinal axis and has a proximal end carried by the base and a distal end, said actuator member comprising an elastic substrate, a shape change layer comprised of a shape memory alloy material having a phase change transition temperature, said material deforming the shape change layer by change in volume from a low temperature shape toward a memory shape responsive to the material being heated through said phase change transition temperature, and means for mounting the shape change layer onto the substrate so that said change in volume causes the actuator member to bend along said longitudinal axis in a first direction for moving said distal end relative to the base, said mounting of the substrate onto the shape change layer establishing a stress force in the substrate which is applied against the shape change layer in a second direction which opposes said first direction of bending of the actuator member and with the stress force moving the distal end in the second direction when the shape memory alloy material is below its phase change transition temperature, and with said element being changed between said actuation modes responsive to movement of the distal end to either of its first or second positions; (c) clamping means for applying an electrostatic force between the distal end and base for selectively clamping the distal end to the base; and (d) heating means for heating the shape memory alloy material through the phase change transition temperature.

2. A microactuator as in claim 1 in which said change in volume is by contraction of the shape change layer which bends the distal end from a first operating position toward a second operating position.

3. A microactuator as in claim 2 in which the substrate is positioned between the shape change layer and the base whereby the stress force applied by the substrate in the second direction yieldably moves the shape change layer and thereby the distal end toward the second operating position.

4. A microactuator as in claim 1 for use as a normally closed valve in which the element is a fluid and the actuation modes comprise opening and closing flow of the fluid along a flowpath, and further characterized in that the base is formed with an orifice for directing the fluid therethrough and along the flowpath, and said change in volume of the shape change layer bends the distal end of the actuator member from a first operating position toward a second operating position with the first and second operating positions respectively closing and opening fluid flow through the orifice.

5. A microactuator as in claim 1 for use as a normally open valve in which the element is a fluid and the actuation modes comprise opening and closing flow of the fluid along a flowpath, and further characterized in that the base is formed with an orifice for directing the fluid therethrough and along the flowpath, and said change in volume of the shape change layer bends the distal end of the actuator member from a first operating position toward a second operating position with the first and second operating positions respectively opening and closing fluid flow through the orifice.

6. A microactuator as in claim 4 in which said change in volume is by contraction of the shape change layer.

7. A microactuator as in claim 1 in which said clamping means means comprises a first layer of electrical charge-carrying material on the side of the substrate which faces the base, a second layer of electrical charge-carrying material on the side of the base which faces the substrate; and means for applying electrical charges of opposite polarity respectively to the first and second layers.

8. A microactuator as in claim 7 in which said first layer of electrical charge-carrying material comprises silicon which is doped with a dopant in an amount sufficient to carry an electric charge.

9. A microactuator as in claim 7 in which said second layer of electrical charge-carrying material comprises silicon doped with a dopant in an amount sufficient to carry an electric charge.

10. A microactuator for use as a valve in controlling the flow of a fluid, the microactuator comprising the combination of (a) a base formed with an orifice for directing the fluid therethrough; (b) a valve actuator which extends along a longitudinal axis and has a proximal end carried by the base and a distal end, said valve actuator comprising an elastic substrate, a shape change layer comprised of a shape memory alloy material having a phase change transition temperature, said material deforming the shape change layer by contraction from a low temperature shape toward a memory shape responsive to the material being heated through said phase change transition temperature, and means for mounting the shape change layer onto the substrate so that said contraction causes the valve actuator to bend along said longitudinal axis in a first direction for moving the distal end of the valve actuator relative to the base and orifice for controlling flow of the fluid through the orifice, said mounting of the substrate onto the shape change layer establishing a stress force in the substrate which is applied against the shape change layer in a second direction which opposes said first direction of bending of the valve actuator and with the stress force moving the distal end in the second direction when the shape memory alloy material is below its phase change transition temperature; (c) clamping means for applying an electrostatic force between the distal end and base for selectively clamping the distal end to the base; and (d) heating means for heating the shape memory alloy material through the phase change transition temperature.

11. A microactuator as in claim 10 in which said contraction of the shape change layer bends the distal end from a first operating position toward a second operating position with the first and second operating positions respectively closing and opening fluid flow through the orifice.

12. A microactuator as in claim 11 in which said change in volume is by contraction of the shape change layer.

13. A microactuator as in claim 1 for use as an electric control in which the element is electricity and the actuation modes comprise opening and closing an electric circuit, and comprising a first electrical contact is carried on the base and is connected in the circuit; a second electrical contact is carried on the distal end of the actuator member and is connected in the circuit, said change in volume of the shape change layer bends the distal end of the actuator member from a first operating position toward a second operating position with the first and second operating positions respectively closing and opening said contacts for respectively closing and opening the circuit.

14. A microactuator as in claim 13 in which said change in volume is by contraction of the shape change layer.

15. A microactuator as in claim 1 in which the element is a sensor and the actuation modes comprise different positions of the sensor, and further comprising means for mounting the sensor for movement with the distal end of the actuator member; and said change in volume of the shape change layer bends the distal end from a first operating position toward a second operating position with the sensor being thereby moved between said different positions.

16. A microactuator as in claim 15 in which said change in volume is by contraction of the shape change layer.

17. A microactuator as in claim 1 in which the element is a light reflecting or refracting device for controlling the path of a light beam and the actuation modes comprise different positions of the device, and further comprising means for mounting the device for movement with the distal end of the actuator member; and said change in volume of the shape change layer bends the distal end from a first operating position toward a second operating position with the device being thereby moved between said different positions.

18. A microactuator as in claim 17 in which said change in volume is by contraction of the shape change layer.

19. A bistable microactuator for controlling an element between two actuation modes, the microactuator comprising the combination of (a) first and second bases mounted in spaced-apart relationship and separated by a gap; (b) an actuator member mounted within the gap between the bases, the actuator member extending along a longitudinal axis and having a proximal end and a distal end, said actuator member comprising first and second elastic substrates mounted in parallel relationship with the substrates having outer sides which face in directions outwardly of the actuator member, first and second shape change layers, each layer being comprised of a shape memory alloy material having a phase change transition temperature, said material deforming the shape change layer by change in volume from a low temperature shape toward a memory shape responsive to the material being heated through said phase change transition temperature, means for mounting the first and second shape change layers onto the outer sides of respective ones of the first and second substrates so that said change in volume of a selected one of the layers causes the actuator member to bend along said longitudinal axis in a direction toward the side of the selected layer whereby said distal end is moved toward respective first and second positions; said mounting of the shape change layers onto the substrates establishing stress forces in the substrates which are applied against the respective shape change layers in directions which oppose the bending of the actuator member and with the stress forces moving the distal end in directions away from said respective first and second positions when the shape memory alloy material is below its phase change transition temperature, and with said element being changed between said actuation modes responsive to movement of the distal end to either of its first or second positions; (c) clamping means for applying electrostatic forces between the distal end and bases for selectively clamping the distal end to the bases when the distal end is in either of said first or second positions; and (d) heating means for heating the shape memory alloy material through the phase change transition temperature of selected ones of the shape change layers.

20. A method of operating a microactuator for controlling an element between different actuation modes, the method comprising the steps of providing an actuator member having a shape change layer mounted on an elastic substrate in which the shape change layer is comprised of a shape memory alloy material having a phase change transition temperature, said material deforming the shape change layer by change in volume from a low temperature shape toward a memory shape responsive to the material being heated through said phase change transition temperature; providing a base which carries a proximal end of the actuator member, with the actuator member having a distal end; heating the shape change layer through the phase change transition temperature and enabling the actuator member to change in volume sufficient to bend the distal end in a first direction to one operating position relative to the base; establishing a stress force in the substrate and applying the stress force against the shape change layer in a second direction which yieldably opposes said bending of the distal end; cooling the shape change layer below the phase change transition temperature and applying the stress force against the actuator member to cause the actuator to change in volume to said low temperature shape while moving the distal end to an other operating position relative to the base; applying an electrostatic force between the distal end of the actuator member and the base sufficient to clamp the base to the actuator member in said one position; and controlling the element to first and second actuation modes responsive to bending of the distal end toward said respective one and other operating positions.

21. A method as in claim 20 in which the element to be controlled comprises an orifice in the base, the method further comprising the steps of directing a fluid into communication with the orifice; occluding the orifice with the distal end of the actuator end to close fluid flow through the orifice when the distal end is in said one operating position; and moving the distal end away from the orifice to open fluid flow through the orifice when the distal end is moved toward said other operating position.

* * * * *